(12) United States Patent
Kim

(10) Patent No.: US 12,334,468 B2
(45) Date of Patent: Jun. 17, 2025

(54) SOLDER REFLOW APPARATUS

(71) Applicant: SAMSUNG ELECTRONICS CO., LTD., Suwon-si (KR)

(72) Inventor: Youngja Kim, Suwon-si (KR)

(73) Assignee: SAMSUNG ELECTRONICS CO., LTD., Suwon-si (KR)

( * ) Notice: Subject to any disclaimer, the term of this patent is extended or adjusted under 35 U.S.C. 154(b) by 27 days.

(21) Appl. No.: 18/136,416

(22) Filed: Apr. 19, 2023

(65) Prior Publication Data
US 2024/0113067 A1    Apr. 4, 2024

(30) Foreign Application Priority Data
Oct. 4, 2022  (KR) .................. 10-2022-0126177

(51) Int. Cl.
| | | |
|---|---|---|
| B23K 3/00 | (2006.01) | |
| B23K 1/00 | (2006.01) | |
| B23K 1/008 | (2006.01) | |
| B23K 1/015 | (2006.01) | |
| B23K 3/08 | (2006.01) | |
| H01L 23/00 | (2006.01) | |
| B23K 101/40 | (2006.01) | |

(52) U.S. Cl.
CPC ............ H01L 24/75 (2013.01); B23K 1/0016 (2013.01); B23K 1/008 (2013.01); B23K 1/015 (2013.01); B23K 3/087 (2013.01); *B23K 2101/40* (2018.08); *H01L 2224/75251* (2013.01); *H01L 2224/75272* (2013.01); *H01L 2224/7555* (2013.01); *H01L 2224/75804* (2013.01); *H01L 2224/7598* (2013.01)

(58) Field of Classification Search
CPC .......... H01L 24/75; H01L 2224/75251; H01L 2224/75272; H01L 2224/7555; H01L 2224/75804; H01L 2224/7598; H01L 24/16; H01L 24/81; B23K 1/0016; B23K 1/008; B23K 1/015; B23K 3/087; B23K 2101/36–42; B23K 1/012; H05K 3/3494
USPC .............. 228/218–219, 234.2, 44.7, 49.5, 43
See application file for complete search history.

(56) References Cited

U.S. PATENT DOCUMENTS

| | | | |
|---|---|---|---|
| 4,840,305 A * | 6/1989 | Ankrom ................... | B23K 3/06 228/180.1 |
| 4,909,429 A * | 3/1990 | Ankrom ............... | H05K 3/3478 269/903 |
| 5,542,596 A | 8/1996 | Climbak | |
| 6,116,497 A | 9/2000 | Scheel et al. | |

(Continued)

FOREIGN PATENT DOCUMENTS

| | | | | |
|---|---|---|---|---|
| CN | 101530954 A | * | 9/2009 | ........... B23K 1/0014 |
| CN | 103367181 A | * | 10/2013 | ............. H01L 24/75 |

(Continued)

*Primary Examiner* — Kiley S Stoner
(74) *Attorney, Agent, or Firm* — MORGAN, LEWIS & BOCKIUS LLP

(57) ABSTRACT

A solder reflow apparatus includes: a reflow chamber configured to receive a heat transfer fluid, wherein the heat transfer fluid transfers heat to a solder for mounting an electronic part on a substrate; a heater configured to heat the heat transfer fluid in the reflow chamber; a stage arranged in the reflow chamber to support the substrate; and a jig disposed on the electronic part and fixing the electronic part.

16 Claims, 8 Drawing Sheets

(56) References Cited

U.S. PATENT DOCUMENTS

| | | | |
|---|---|---|---|
| 7,455,213 B2* | 11/2008 | Nishiyama | H01L 25/50 |
| | | | 228/223 |
| 7,748,600 B2 | 7/2010 | Leicht | |
| 9,368,372 B1* | 6/2016 | Okishima | H01L 23/49568 |
| 9,673,061 B2 | 6/2017 | Huang | |
| 2012/0244666 A1* | 9/2012 | Mukai | H01L 21/563 |
| | | | 438/126 |
| 2019/0164928 A1* | 5/2019 | Yoshino | H01L 24/78 |

FOREIGN PATENT DOCUMENTS

| | | | | |
|---|---|---|---|---|
| CN | 109411373 A | * | 3/2019 | |
| CN | 110164783 A | * | 8/2019 | B23K 37/0408 |
| CN | 110181187 A | * | 8/2019 | B23K 28/02 |
| CN | 110449689 A | * | 11/2019 | |
| CN | 110640256 A | * | 1/2020 | |
| CN | 110961741 A | * | 4/2020 | B23K 1/008 |
| CN | 111958079 A | * | 11/2020 | |
| CN | 113210786 A | * | 8/2021 | B23K 3/00 |
| CN | 113953618 A | * | 1/2022 | |
| EP | 0218391 A1 | * | 4/1987 | |
| EP | 3851235 A1 | * | 7/2021 | B23K 1/015 |
| JP | 2004087611 A | * | 3/2004 | H01L 24/27 |
| JP | 2007125578 A | * | 5/2007 | H01L 24/11 |
| JP | 4100578 B2 | * | 6/2008 | B23K 1/008 |
| JP | 2015032828 A | * | 2/2015 | B23K 1/0016 |
| JP | 2016129205 A | * | 7/2016 | H01L 21/561 |
| JP | 2021-0154334 | | 10/2021 | |
| KR | 20080017914 A | * | 2/2008 | |
| KR | 20100094255 A | * | 8/2010 | |
| KR | 20110101265 A | * | 9/2011 | |
| KR | 10-2021-0102460 | | 8/2021 | |
| TW | 201332084 A | * | 8/2013 | H01L 24/75 |

* cited by examiner

SOLDER REFLOW APPARATUS

CROSS-REFERENCE TO RELATED APPLICATION

This application claims priority under 35 USC § 119 to Korean Patent Application No. 10-2022-0126177, filed on Oct. 4, 2022 in the Korean Intellectual Property Office (KIPO), the disclosure of which is incorporated by reference herein in its entirety.

TECHNICAL FIELD

Example embodiments of the present inventive concept relate to a solder reflow apparatus. More particularly, example embodiments of the present inventive concept relate to a solder reflow apparatus using a vapor phase soldering.

DISCUSSION OF THE RELATED ART

Generally, in a surface mount technology, a convection reflow, a laser assisted bonding, a vapor phase soldering, etc., may be used for soldering a solder paste. In the vapor phase soldering, a heated heat transfer fluid may transfer heat to a solder for mounting an electronic part, such as a semiconductor chip, onto a substrate. After transferring the heat, the heat transfer fluid may be condensed to form a liquid.

According to related arts, the liquid formed by the condensation of the heat transfer fluid may be used to slip the semiconductor chip onto the substrate. The slipped semiconductor chip may be misaligned with the substrate to electrically disconnect the semiconductor chip from the substrate.

SUMMARY

According to an example embodiment of the present inventive concept, a solder reflow apparatus includes: a reflow chamber configured to receive a heat transfer fluid, wherein the heat transfer fluid transfers heat to a solder for mounting an electronic part on a substrate; a heater configured to heat the heat transfer fluid in the reflow chamber; a stage arranged in the reflow chamber to support the substrate; and a jig disposed on the electronic part and fixing the electronic part.

According to an example embodiment of the present inventive concept, a solder reflow apparatus includes: a reflow chamber configured to receive a heat transfer fluid, wherein the heat transfer fluid transfers heat to a solder for mounting a semiconductor chip on a package substrate; a heater configured to heat the heat transfer fluid in the reflow chamber; a stage, wherein the package substrate is disposed on the stage; and a jig contacting an upper surface of the semiconductor chip, and including a vacuum line for fixing the semiconductor chip by using a vacuum, wherein the jig has a width larger than a width of the semiconductor chip.

According to an example embodiment of the present inventive concept, a solder reflow apparatus includes: a reflow chamber configured to receive a heat transfer fluid, wherein the heat transfer fluid transfers heat to a solder for mounting a semiconductor chip on a package substrate; a heater configured to heat the heat transfer fluid in the reflow chamber; a stage arranged in the reflow chamber and disposed below the package substrate; a lifter configured to move the stage; and a jig contacting an upper surface of the semiconductor chip, and including a vacuum line for fixing the semiconductor chip by using vacuum to prevent a slip of the semiconductor chip, which is caused by a liquid generated by a condensation of the heat transfer fluid, wherein the jig includes a slant surface downwardly inclined from a central portion of a lower surface of the jig to an edge portion of the lower surface of the jig to induce the liquid to move from the central portion to the edge portion in the jig.

BRIEF DESCRIPTION OF THE DRAWINGS

The above and other features of the present inventive concept will become more apparent by describing in detail example embodiments thereof, with reference to the accompanying drawings, in which.

DETAILED DESCRIPTION OF THE EMBODIMENTS

Hereinafter, example embodiments of the present inventive concept will be explained in detail with reference to the accompanying drawings.

Figure 1:
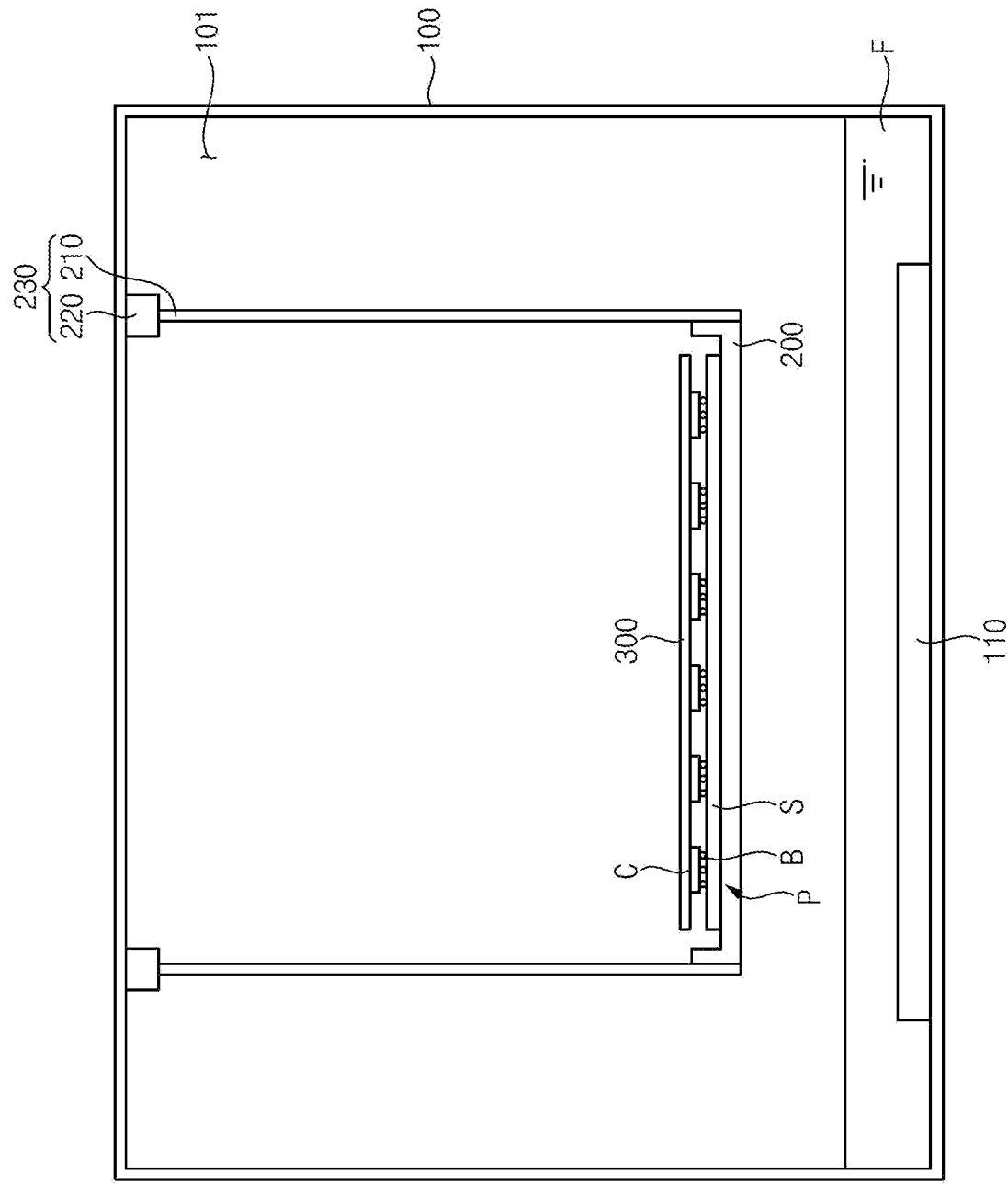
FIG. 1 is a cross-sectional view illustrating a solder reflow apparatus in accordance with an example embodiment of the present inventive concept.
Figure 2:
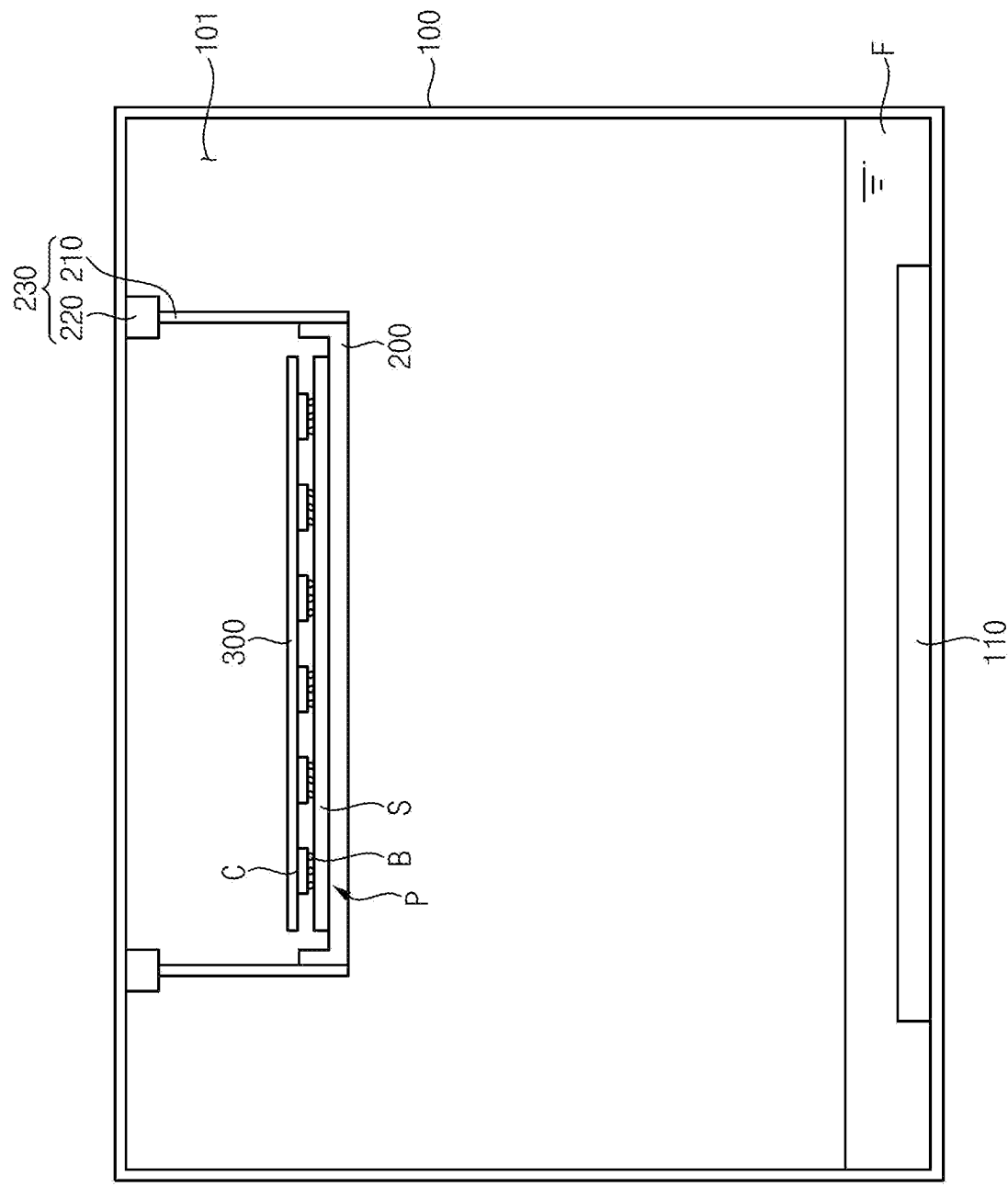
FIG. 2 is a cross-sectional view illustrating an ascended stage in the solder reflow apparatus in FIG. 1.
Figure 3:
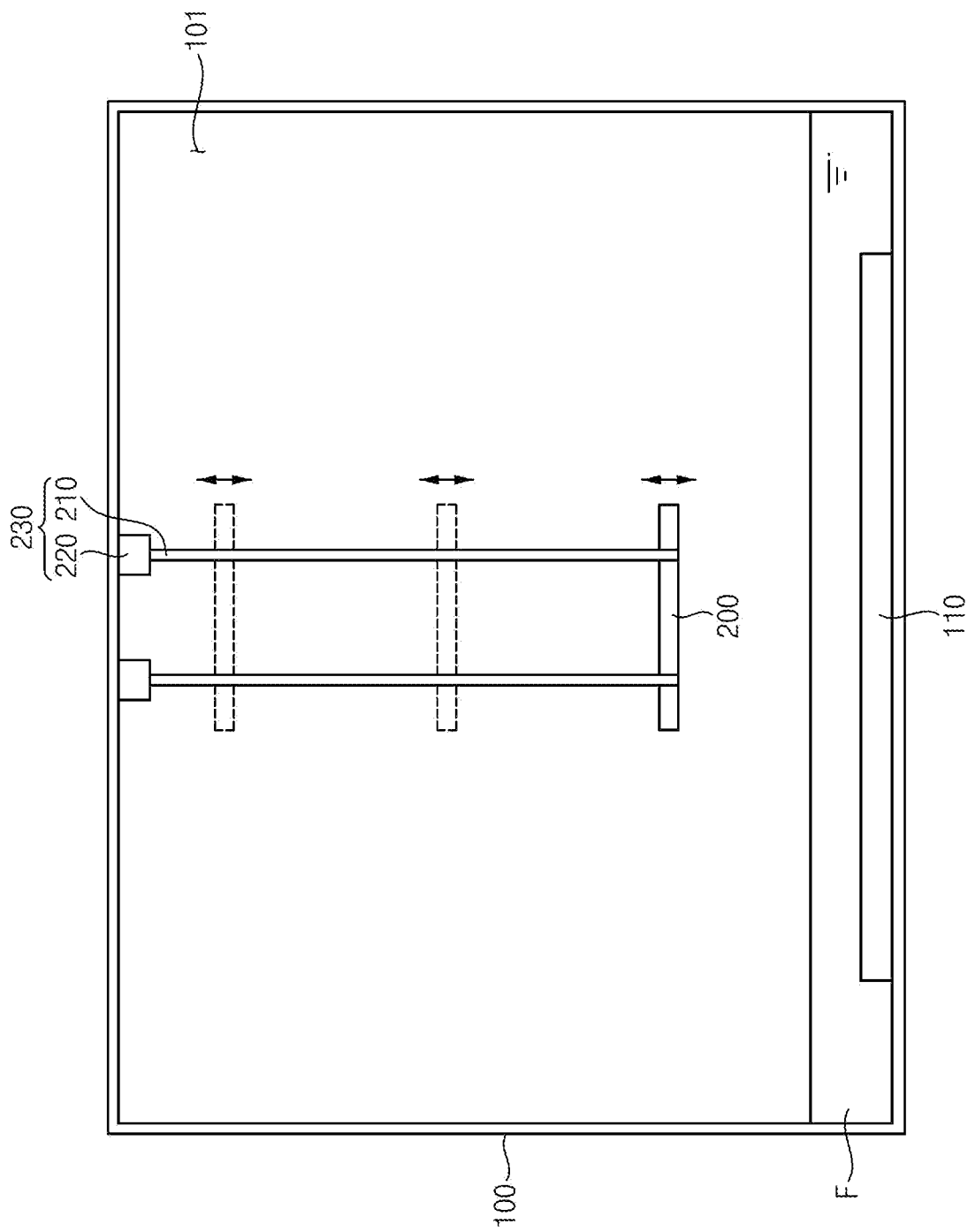
FIG. 3 is a side view illustrating the solder reflow apparatus in FIG. 1.

FIG. 1 is a cross-sectional view illustrating a solder reflow apparatus in accordance with an example embodiment of the present inventive concept, FIG. 2 is a cross-sectional view illustrating an ascended stage in the solder reflow apparatus in FIG. 1 and FIG. 3 is a side view illustrating the solder reflow apparatus in FIG. 1.

Referring to FIGS. 1 to 3, a solder reflow apparatus may be used for soldering an electronic part on a substrate. For example, the solder reflow apparatus may be used for manufacturing a semiconductor package P. For example, the semiconductor package P may include a package substrate S, a semiconductor chip C, conductive bumps B, etc. The package substrate S may correspond to the substrate. The semiconductor chip C may correspond to the electronic part. The conductive bumps B may be interposed between the package substrate S and the semiconductor chip C. The conductive bumps B may be attached to the package substrate S and the semiconductor chip C by a soldering process performed by the solder reflow apparatus.

The solder reflow apparatus may include a reflow chamber 100, a heater 110, a stage 200, a lifter 230 and a jig 300. For example, the solder reflow apparatus may further include a temperature sensor configured to monitor a temperature in the reflow chamber 100.

In some example embodiments of the present inventive concept, the solder reflow apparatus may correspond to a vapor phase soldering type apparatus configured to solder a solder paste by using a heated saturated vapor in the reflow chamber 100.

The reflow chamber 100 may include a reservoir configured to receive a heat transfer fluid F. For example, the reservoir may be a lower region in the reflow chamber 100. The reflow chamber 100 may include a space 101 filled with a gas generated by heating the heat transfer fluid F. The space 101 may be a remaining space in the reflow chamber 100 except for the reservoir. The reflow chamber 100 may be extended in a vertical direction to have a height. The vapor, which may be generated by evaporating the heat transfer fluid F, may move in an upward direction. The vapor may be condensed to form a liquid. The liquid may move in a downward. The liquid may then be collected in the reservoir.

An internal pressure of the reflow chamber 100 may be an atmospheric pressure. In addition, the reflow chamber 100 may be connected to an exhaust apparatus such as a vacuum pump to control the internal pressure of the reflow chamber 100. The internal pressure of the reflow chamber 100 may be maintained for changing a boiling point of the heat transfer fluid F or for soldering environments. For example, the internal pressure of the reflow chamber 100 may be controlled by controlling the amount of heat being applied to the heat transfer fluid F from the heater 110.

The heat transfer fluid F may be a chemical for providing the vapor for the soldering. The heat transfer fluid F may be selected in accordance with the boiling point of the heat transfer fluid F, environment influences, corrosiveness of the vapor, etc. The heat transfer fluid F may include an inert organic liquid. For example, the heat transfer fluid F may include a Galden solution in perfluoropolyether (PFPEs). The Galden solution may have a boiling point of about 230° C.

The heater 110 may heat the heat transfer fluid F in the reflow chamber 100 to generate a saturated vapor. The heater 110 may include an electrical resistor dipped into the heat transfer fluid F on a bottom surface of the reflow chamber 100. In addition, the heater 100 may include a coil-shaped resistor configured to surround the reservoir.

Additionally, a heater as a part of a temperature controller may be installed at a sidewall of the reflow chamber 100 to control internal temperatures of the reflow chamber 100.

The stage 200 may be configured to move in the vertical direction in the reflow chamber 100. The lifer 230 may lift the stage 200. The lifter 230 may include an actuator such as a transfer rail, a transfer screw, a transfer belt, etc. Transfer rods 210 may support both ends of the stage 210. A linear actuator 220 may lift the stage 200 along the transfer rods 210.

As mentioned above, the vapor generated from heating the heat transfer fluid F by using the heater 110 may transfer heat to the solder. After the heat may be transferred from the vapor to the solder, the vapor may then be condensed to generate the liquid. The liquid may be downwardly moved so that the liquid may be collected in the reservoir of the reflow chamber 100. During the downward movement of the liquid, the liquid may be formed to have a thin film. The thin liquid film may slip the semiconductor chip C.

To prevent the slip of the semiconductor chip C, the jig 300 may be configured to fix the semiconductor chip C. The jig 300 may be arranged over the semiconductor chip C. The jig 300 may be disposed on an upper surface of the semiconductor chip C. For example, the jig 300 may compress the upper surface of the semiconductor chip C to fix the semiconductor chip C.

The jig 300 may fix the semiconductor chip C using a weight of the jig 300. Thus, it may be desirable to provide the jig 300 with the weight so that the jig 300 may fix the semiconductor chip C. For example, the jig 300 may include a metal having a heavy weight, not limited thereto.

Figure 4:
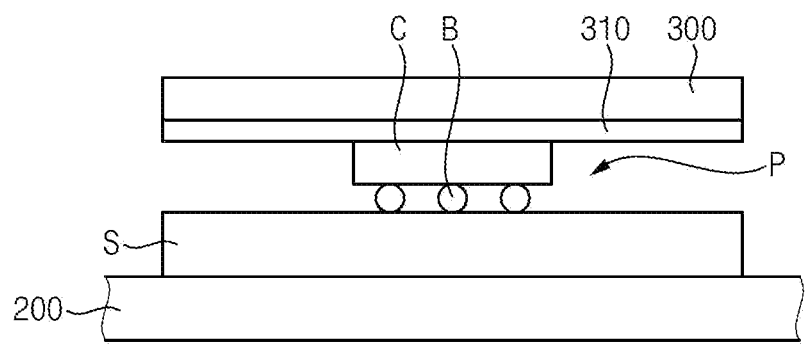
FIG. 4 is an enlarged cross-sectional view illustrating a jig of the solder reflow apparatus in FIG. 1.

FIG. 4 is an enlarged cross-sectional view illustrating a jig of the solder reflow apparatus in FIG. 1.

Referring to FIG. 4, the jig 300 may have a rectangular parallelepiped shape; however, the present inventive concept is not limited thereto, and for example, the jig 300 may have another polygonal shape, circular, or round shape. Thus, the jig 300 may have an upper surface, a flat lower surface and side surfaces. The flat lower surface of the jig 300 may be disposed on the upper surface of the semiconductor chip C. For example, the flat lower surface of the jig 300 may make contact the upper surface of the semiconductor chip C.

In some example embodiments of the present inventive concept, the jig 300 may have a width wider than a width of the semiconductor chip C. Thus, a central portion of the lower surface of the jig 300 may make contact with all the upper surface of the semiconductor chip C. In addition, an edge portion of the lower surface of the jig 300 might not cover the upper surface of the semiconductor chip C. Thus, the edge portion of the lower surface of the jig 300 may be downwardly exposed. For example, the edge portion of the jig 300 may be exposed.

In some example embodiments of the present inventive concept, the jig 300 may include an absorption layer 310. The absorption layer 310 may be arranged on the lower surface of the jig 300. A lower surface of the absorption layer 310 may be disposed on the upper surface of the semiconductor chip C. Thus, for example, a central portion of a lower surface of the absorption layer 310 may make contact with the upper surface of the semiconductor chip C. In addition, an edge portion of the lower surface of the absorption layer 310 may be exposed by the semiconductor chip C.

The absorption layer 310 may absorb the liquid generated from the heat transfer fluid F. The absorption layer 310 may include various materials for absorbing the liquid, but the present inventive concept is not limited to a specific material. For example, the absorption layer 310 may be porous.

The absorption layer 310 may absorb the liquid so that applications of the liquid film to the semiconductor chip C may be suppressed. Thus, the slip of the semiconductor chip C by the liquid film may be prevented. When the absorption layer 310 absorbs enough of the liquid such that it reaches a saturated state, the jig 300 may be unloaded from the reflow chamber 100. The liquid in the absorption layer 310 may then be removed. The jig 300 including the absorption layer 310, which is without the liquid, may be loaded into the reflow chamber 100. The jig 300 may then be used for a following soldering process.

Figure 5:
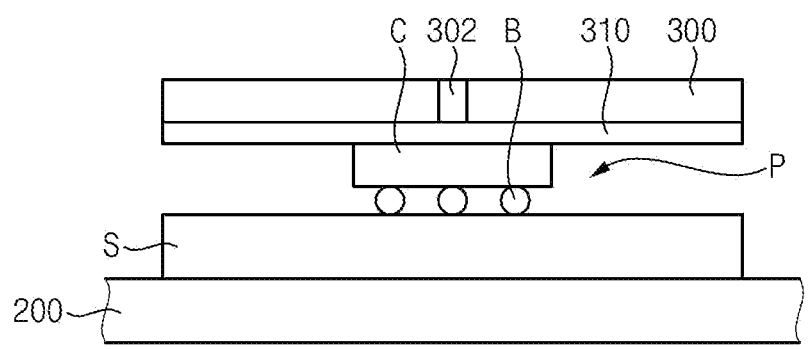
FIG. 5 is an enlarged cross-sectional view illustrating a jig of a solder reflow apparatus in accordance with an example embodiment of the present inventive concept.

FIG. 5 is an enlarged cross-sectional view illustrating a jig of a solder reflow apparatus in accordance with an example embodiment of the present inventive concept.

A jig according to the present example embodiment of the present inventive concept, as illustrated in FIG. 5, may have a structure substantially the same as the structure of the jig 300 in FIG. 4 except for further including a vacuum line. Thus, in the following example embodiments of the present inventive concept, a description of substantially the same configuration and elements as that of the previously described embodiments may be omitted or simplified, and differences will be mainly described.

Referring to FIG. 5, the jig 300 according to an example embodiment of the present inventive concept may further include the vacuum line 302. The vacuum line 302 may be formed through the jig 300 in the vertical direction. A vacuum may be applied to the semiconductor chip C through the vacuum line 302. Thus, the jig 300 may firmly fix the semiconductor chip C using a suction from the vacuum as well as the weight of the jig 300.

Figure 6:
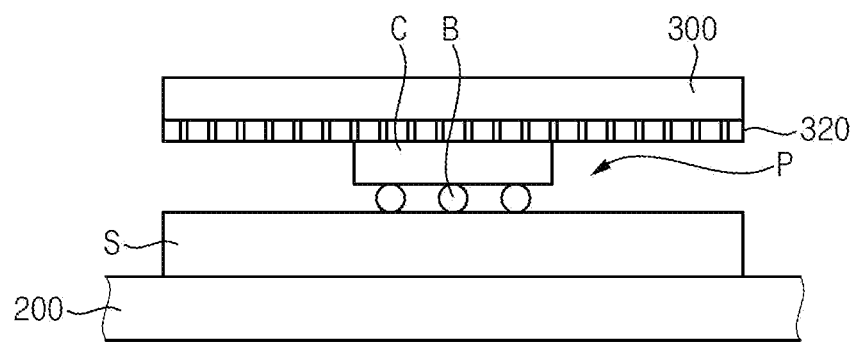
FIG. 6 is an enlarged cross-sectional view illustrating a jig of a solder reflow apparatus in accordance with an example embodiment of the present inventive concept.

FIG. 6 is an enlarged cross-sectional view illustrating a jig of a solder reflow apparatus in accordance with an example embodiment of the present inventive concept.

Referring to FIG. 6, a jig 300 according to an example embodiment of the present inventive concept may include a porous layer 320. The porous layer 320 may include a plurality of holes through which the liquid may pass. The porous layer 320 may be arranged on the lower surface of the jig 300. For example, the porous layer 320 may include holes that completely penetrate the porous layer 320. The liquid may flow through the porous layer 320 on the edge portion of the jig 300. For example, the liquid may downwardly or upwardly flow through the porous layer 320 on the edge portion of the jig 300.

Therefore, the liquid may pass through the porous layer 320 to suppress the applications of the liquid film to the semiconductor chip C. As a result, the slip of the semiconductor chip C by the liquid film may be prevented. In some example embodiments of the present inventive concept, the porous layer 320 may include ceramic, but the present inventive concept is not limited thereto.

Additionally, the jig 300 according to an example embodiment of the present inventive concept may further include the vacuum line 302 in FIG. 5. The vacuum provided through the vacuum line 302 may be applied to the semiconductor chip C through the porous layer 320. Further, the porous layer 320 may function so as to enlarge a contact area between the jig 300 and the semiconductor chip C so that the jig 300 may more firmly fix the semiconductor chip C.

Figure 7:
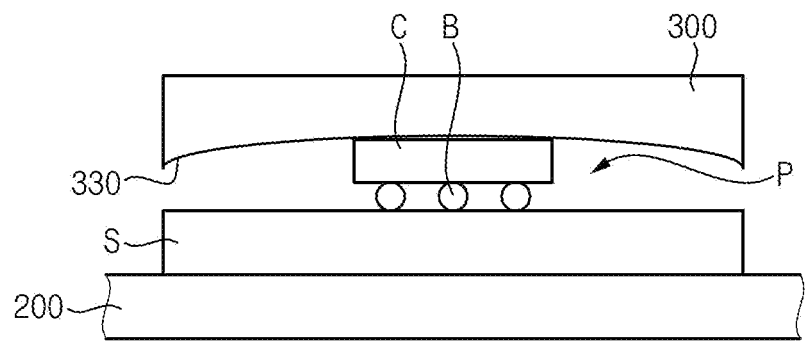
FIG. 7 is an enlarged cross-sectional view illustrating a jig of a solder reflow apparatus in accordance with an example embodiment of the present inventive concept.

FIG. 7 is an enlarged cross-sectional view illustrating a jig of a solder reflow apparatus in accordance with an example embodiment of the present inventive concept.

Referring to FIG. 7, a jig 300 according to an example embodiment of the present inventive concept may include a slant surface 330. The slant surface 330 may be downwardly extended from a central portion of the lower surface of the jig 300 to the edge portion of the lower surface of the jig 300. For example, the slant surface 330 may have a concave shape or straight sides that are slanted at an angle from the central portion of the lower surface of the jig 300 to the edge portion of the lower surface of the jig 300.

The slant surface 330 may be configured to induce the liquid to travel from the central portion of the lower surface of the jig 300 to the edge portion of the lower surface of the jig 300. Thus, the liquid may flow toward the edge portion of the jig 300 along the slant surface 330 to suppress the applications of the liquid film to the semiconductor chip C. As a result, the slip of the semiconductor chip C by the liquid film may be prevented.

Additionally, the jig 300 according to an example embodiment of the present inventive concept may further include the vacuum line 302 in FIG. 5.

Figure 8:
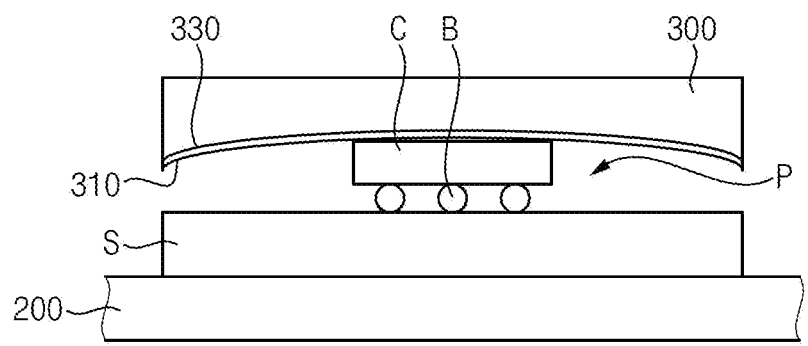
FIG. 8 is an enlarged cross-sectional view illustrating a jig of a solder reflow apparatus in accordance with an example embodiment of the present inventive concept.

FIG. 8 is an enlarged cross-sectional view illustrating a jig of a solder reflow apparatus in accordance with an example embodiment of the present inventive concept.

A jig according to the present example embodiment of the present inventive concept, as illustrated in FIG. 8, may have a structure substantially the same as the structure of the jig 300 in FIG. 7 except for further including the absorption layer 310. Thus, in the following example embodiments of the present inventive concept, a description of substantially the same configuration and elements as that of the previously described embodiments may be omitted or simplified, and differences will be mainly described.

Referring to FIG. 8, the absorption layer 310 may be arranged on the slant surface 330 of the jig 300. The absorption layer 310 may have functions substantially the same as the functions of the absorption layer 310 in FIG. 4. Thus, any further illustrations with respect to the absorption layer 310 that may be redundant may be omitted or briefly discussed herein for brevity.

Therefore, the liquid flowing on the slant surface 330 of the jig 300 may be absorbed in the absorption layer 310. The applications of the liquid film to the semiconductor chip C may be suppressed to prevent the slip of the semiconductor chip C by the liquid film.

Additionally, the jig 300 according to an example embodiment of the present inventive concept may further include the vacuum line 302 in FIG. 5.

Figure 9:
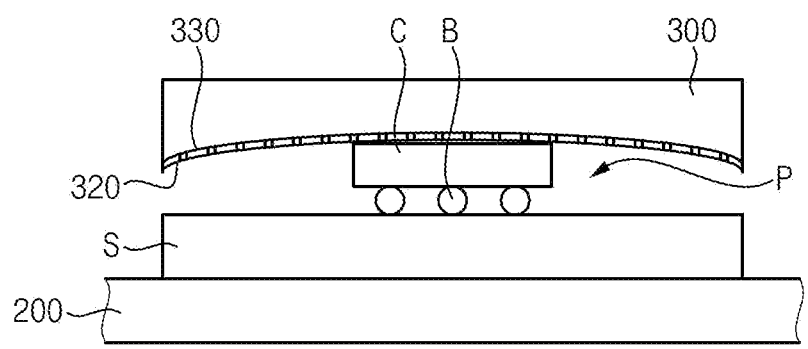
FIG. 9 is an enlarged cross-sectional view illustrating a jig of a solder reflow apparatus in accordance with an example embodiment of the present inventive concept.

FIG. 9 is an enlarged cross-sectional view illustrating a jig of a solder reflow apparatus in accordance with an example embodiment of the present inventive concept.

A jig according to the present example embodiment of the present inventive concept may have a structure substantially the same as the structure of the jig 300 in FIG. 7 except for further including the porous layer 320. Thus, in the following example embodiments of the present inventive concept, a description of substantially the same configuration and elements as that of the previously described embodiments may be omitted or simplified, and differences will be mainly described.

Referring to FIG. 9, the porous layer 320 may be arranged on the slant surface 330 of the jig 300. The porous layer 320 may have functions substantially the same as the functions of the porous layer 320 in FIG. 6. Thus, any further illustrations with respect to the porous layer 330 that may be redundant may be omitted or briefly discussed herein for brevity.

Therefore, the liquid flowing on the slant surface 330 of the jig 300 may pass through the porous layer 330. The applications of the liquid film to the semiconductor chip C may be suppressed to prevent the slip of the semiconductor chip C by the liquid film.

Additionally, the jig 300 according to an example embodiment of the present inventive concept may further include the vacuum line 302 in FIG. 5.

Figure 10:
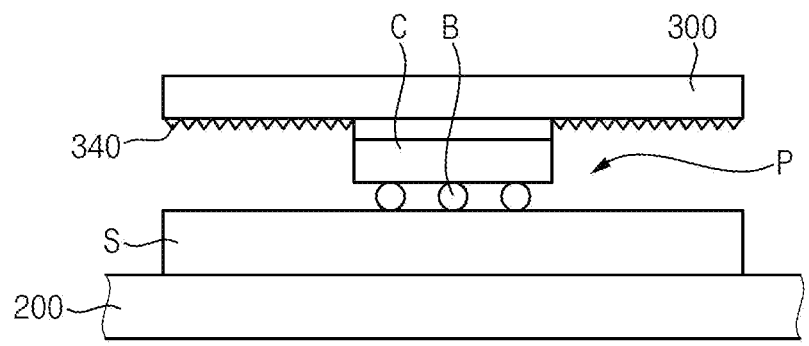
FIG. 10 is an enlarged cross-sectional view illustrating a jig of a solder reflow apparatus in accordance with an example embodiment of the present inventive concept.
Figure 11:
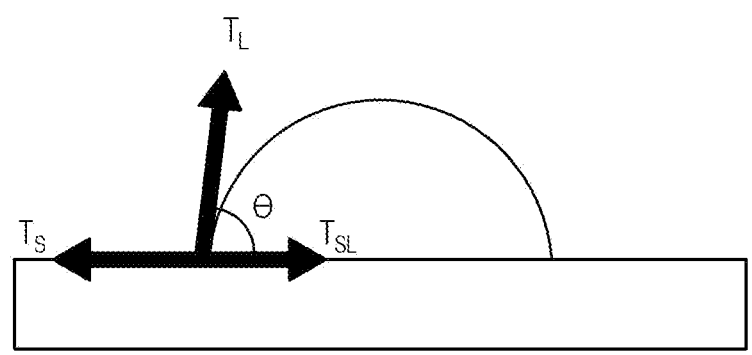
FIG. 11 is a view illustrating an operation of an uneven portion in the jig of FIG. 10.

FIG. 10 is an enlarged cross-sectional view illustrating a jig of a solder reflow apparatus in accordance with an example embodiment of the present inventive concept and FIG. 11 is a view illustrating an operation of an uneven portion in the jig of FIG. 10.

Referring to FIG. 10, an uneven portion 340 may be formed at the lower surface of the jig 300. For example, the uneven portion 340 may be formed at the exposed edge portion of the lower surface of the jig 300. The uneven portion 340 may function so as to suppress the condensation of the vapor. For example, the uneven portion 340 may suppress the generations of the liquid causing the slip of the semiconductor chip C.

Referring to FIG. 11, when the liquid may exist on the lower surface of the jig 300, a surface tension $T_S$ of the lower surface of the jig 300 may be represented by following Formula.

$$T_S = T_L \times \cos\theta + T_{SL}$$

In Formula, $T_L$ may be a surface tension of the liquid. $T_{SL}$ may be a boundary tension between the lower surface of the jig 300 and the liquid. θ may be an angle between $T_L$ and $T_{SL}$.

The angle θ between the surface tension $T_L$ of the liquid and the boundary tension $T_{SL}$ between the lower surface of the jig 300 and the liquid may be determined by roughness of the lower surface of the jig 300. The roughness may be controlled by the uneven portion 340. When the angle θ between the surface tension $T_L$ of the liquid and the boundary tension $T_{SL}$ between the lower surface of the jig 300 and the liquid may be about 90° to about 120°, condensation efficiency of the vapor may be greatly decreased. Thus, the roughness of the lower surface of the jig 300 may be controlled by using the uneven portion 340 to provide the angle θ of about 90° to about 120°, thereby preventing the condensation of the vapor. As a result, the generation of the liquid may also be suppressed to prevent the slip of the semiconductor chip C by the liquid film.

Figure 12:
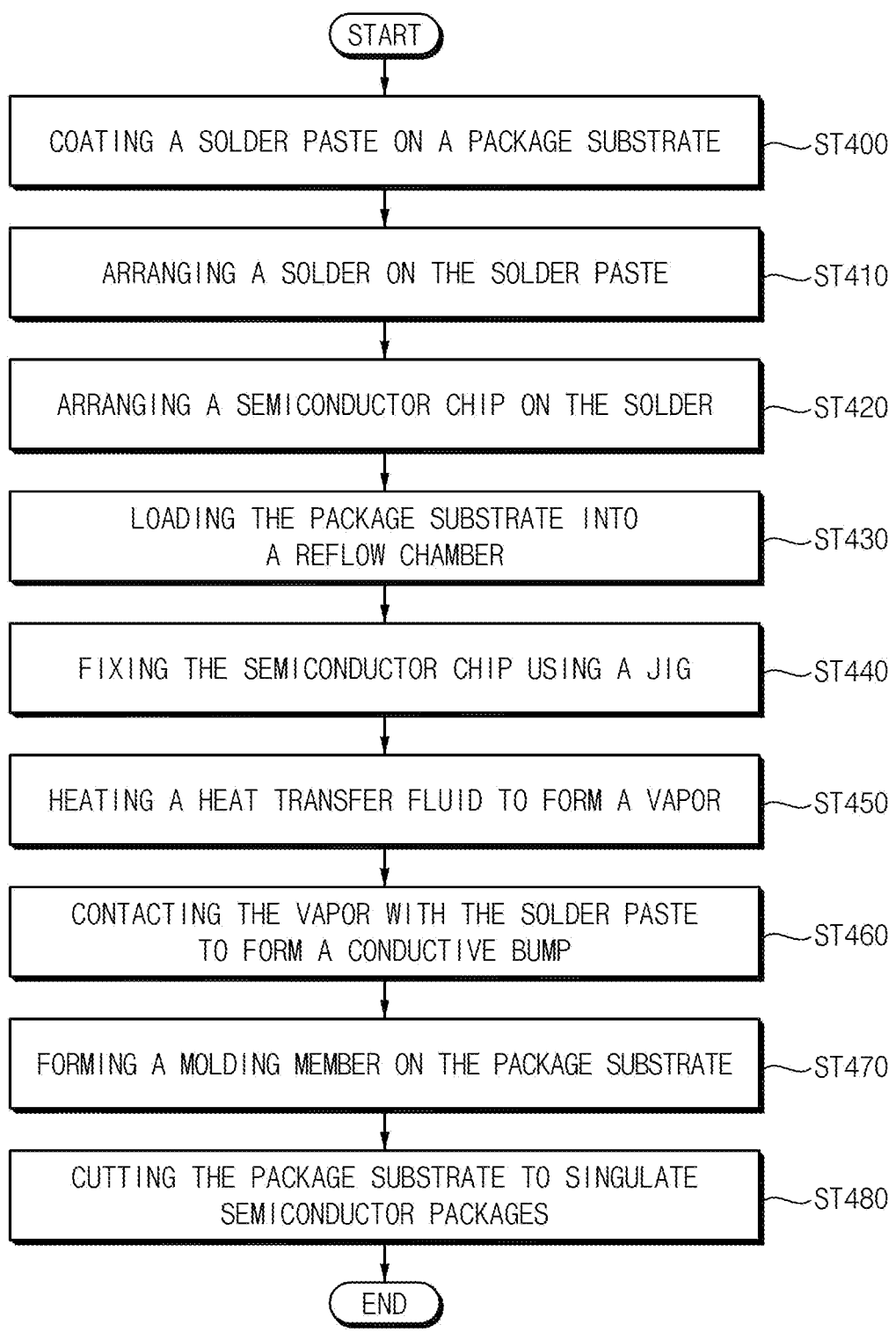
FIG. 12 is a flow chart illustrating a method of manufacturing a semiconductor package using the solder reflow apparatus in FIG. 1 according to an example embodiment of the present inventive concept.

FIG. 12 is a flow chart illustrating a method of manufacturing a semiconductor package using the solder reflow apparatus in FIG. 1 according to an example embodiment of the present inventive concept.

Referring to FIGS. 1 and 12, in step ST400, the solder paste may be coated on the upper surface of the package substrate S.

In some example embodiments of the present inventive concept, the solder paste may be printed on the package substrate S. For example, the solder paste may be printed by a stencil printer. The stencil may have a plurality of holes corresponding to an arrangement of the conductive bumps B.

In step ST410, the solder may be arranged on the solder paste.

In step ST420, the semiconductor chip C may be arranged on the solder.

In step ST430, the package substrate S with the semiconductor chip C may be loaded into the reflow chamber 100.

In step ST440, the jig 300 may be arranged on the upper surface of the semiconductor chip C to fix the semiconductor chip C. When the jig 300 may include the vacuum line 302 in FIG. 5, the jig 300 may fix the semiconductor chip C using the vacuum.

In step ST450, the heater 110 may heat the heat transfer fluid F to form the vapor from the heat transfer fluid F.

In step ST460, the lifter 230 may upwardly move the stage 200 to contact the vapor with the solder paste. The solder paste may be heated to reflow the solder, thereby forming the conductive bumps B between the package substrate S and the semiconductor chip C.

In the reflow process, the vapor, which may transfer the heat to the solder, may be condensed to form the liquid. The liquid may move downwardly in a liquid film. Although the liquid film may be applied to the semiconductor chip C, the semiconductor chip C might not be slipped because the jig 300 may firmly fix the semiconductor chip C. Further, the absorption layer 310 may absorb the liquid to suppress the application of the liquid film to the semiconductor chip C.

When the jig 300 may include the porous layer 320 in FIG. 6, the liquid may pass through the porous layer 320 on the edge portion of the jig 300. When the jig 300 may have the slant surface 330 in FIG. 7, the liquid may be induced to move to the edge portion of the jig 300 along the slant surface 330. When the jig 300 may include the uneven portion 340 in FIG. 10, the condensation of the vapor may be suppressed by the uneven portion 340.

In step ST470, a molding member may be formed on the package substrate S to cover the semiconductor chip C.

In step ST480, the package substrate S may be cut along scribe lanes to singulate the semiconductor packages P.

By the above-mentioned processes, the semiconductor package P, including a logic device or a memory device, and a semiconductor module including the semiconductor package P may be manufactured. For example, the semiconductor package P may include the logic device such as a central processing unit (CPU), an application processor (AP), etc., a volatile memory device such as an SRAM device, a DRAM device, an HBM device, etc., and a non-volatile memory device such as a flash memory device, a PRAM device, an MRAM device, an RRAM device.

According to some example embodiments of the present inventive concept, the jig may fix the electronic part on the substrate by using the weight of the jig and/or the vacuum. Thus, the slip of the electronic part, which may be caused by a liquid generated by the condensation of a vapor, may be prevented. Further, the slant surface, which may be formed at the lower surface of the jig, may induce the liquid to travel from the central portion of the lower surface to the edge portion of the lower surface in the jig so that the slip of the electronic part that may be caused by the liquid may be prevented. As a result, after a soldering process, the electronic part may be accurately aligned with the substrate to increase an electrical connection between the electronic part and the substrate.

While the present inventive concept has been described with reference to example embodiments thereof, it will be understood by those of ordinary skill in the art that various changes in form and details may be made thereto without departing from the spirit and scope of the present inventive concept.

What is claimed is:

1. A solder reflow apparatus comprising:
   a reflow chamber configured to receive a heat transfer fluid, wherein the heat transfer fluid transfers heat to a solder for mounting an electronic part on a substrate;
   a heater configured to heat the heat transfer fluid in the reflow chamber;
   a stage arranged in the reflow chamber to support the substrate; and
   a jig disposed on the electronic part and fixing the electronic part,
   wherein a lower surface of the jig includes a slant surface.

2. The solder reflow apparatus of claim 1, wherein the jig has a width larger than a width of the electronic part.

3. The solder reflow apparatus of claim 2, wherein the jig comprises an absorption layer arranged on the lower surface of the jig to absorb a liquid generated by a condensation of the heat transfer fluid.

4. The solder reflow apparatus of claim 2, wherein the jig comprises a porous layer arranged on the lower surface of the jig, wherein a liquid, which is generated by a condensation of the heat transfer fluid, travels through the porous layer.

5. The solder reflow apparatus of claim 4, wherein the porous layer comprises ceramic.

6. The solder reflow apparatus of claim 2, wherein the slant surface is downwardly inclined from a central portion of the lower surface of the jig to an edge portion of the lower surface of the jig to induce a liquid, which is generated by a condensation of the heat transfer fluid, to move from the central portion to the edge portion in the jig.

7. The solder reflow apparatus of claim 1, further comprising a lifter configured to lift the stage.

8. The solder reflow apparatus of claim 1, wherein the substrate comprises a package substrate, and the electronic part comprises a semiconductor chip.

9. A solder reflow apparatus comprising:
- a reflow chamber configured to receive a heat transfer fluid, wherein the heat transfer fluid transfers heat to a solder for mounting a semiconductor chip on a package substrate;
- a heater configured to heat the heat transfer fluid in the reflow chamber;
- a stage, wherein the package substrate is disposed on the stage; and
- a jig contacting an upper surface of the semiconductor chip, and including a vacuum line for fixing the semiconductor chip by using a vacuum, wherein the jig has a width larger than a width of the semiconductor chip, wherein a lower surface of the jig includes a slant surface.

10. The solder reflow apparatus of claim 9, wherein the jig comprises an absorption layer arranged on the lower surface of the jig to absorb a liquid generated by a condensation of the heat transfer fluid.

11. The solder reflow apparatus of claim 9, wherein the jig comprises a porous layer arranged on the lower surface of the jig, wherein a liquid, which is generated by a condensation of the heat transfer fluid, travels through the porous layer.

12. The solder reflow apparatus of claim 9, wherein the slant surface is downwardly inclined from a central portion of the lower surface of the jig to an edge portion of the lower surface of the jig to induce a liquid, which is generated by a condensation of the heat transfer fluid, to move from the central portion to the edge portion in the jig.

13. The solder reflow apparatus of claim 9, further comprising a lifter configured to lift the stage.

14. A solder reflow apparatus comprising:
- a reflow chamber configured to receive a heat transfer fluid, wherein the heat transfer fluid transfers heat to a solder for mounting a semiconductor chip on a package substrate;
- a heater configured to heat the heat transfer fluid in the reflow chamber;
- a stage arranged in the reflow chamber and disposed below the package substrate;
- a lifter configured to move the stage; and
- a jig contacting an upper surface of the semiconductor chip, and including a vacuum line for fixing the semiconductor chip by using vacuum to prevent a slip of the semiconductor chip, which is caused by a liquid generated by a condensation of the heat transfer fluid,
- wherein the jig comprises a slant surface downwardly inclined from a central portion of a lower surface of the jig to an edge portion of the lower surface of the jig to induce the liquid to move from the central portion to the edge portion in the jig.

15. The solder reflow apparatus of claim 14, wherein the jig comprises an absorption layer arranged on the lower surface of the jig to absorb the liquid.

16. The solder reflow apparatus of claim 14, wherein the jig comprises a porous layer arranged on the lower surface of the jig, and including a plurality of holes.

* * * * *